United States Patent
Brottier et al.

(10) Patent No.: US 11,545,932 B2
(45) Date of Patent: Jan. 3, 2023

(54) PHOTOVOLTAIC AND THERMAL SOLAR PANEL

(71) Applicant: DUALSUN, Marseilles (FR)

(72) Inventors: Laetitia Brottier, Malakoff (FR); Jerome Mouterde, Marseilles (FR)

(73) Assignee: DUALSUN, Marseilles (FR)

( * ) Notice: Subject to any disclaimer, the term of this patent is extended or adjusted under 35 U.S.C. 154(b) by 931 days.

(21) Appl. No.: 16/090,924

(22) PCT Filed: Apr. 4, 2016

(86) PCT No.: PCT/FR2016/050765
§ 371 (c)(1),
(2) Date: Mar. 1, 2019

(87) PCT Pub. No.: WO2016/156764
PCT Pub. Date: Oct. 6, 2016

(65) Prior Publication Data
US 2019/0181802 A1  Jun. 13, 2019

(30) Foreign Application Priority Data

Apr. 3, 2015 (FR) ...................................... 1552907

(51) Int. Cl.
H02S 40/44 (2014.01)
H01L 31/054 (2014.01)
H01L 31/052 (2014.01)

(52) U.S. Cl.
CPC .......... *H02S 40/44* (2014.12); *H01L 31/0521* (2013.01); *H01L 31/0547* (2014.12); *Y02E 10/52* (2013.01); *Y02E 10/60* (2013.01)

(58) Field of Classification Search
CPC ........ H02S 40/42; H02S 40/425; H02S 40/44; H01L 31/0525; H01L 31/0521
See application file for complete search history.

(56) References Cited

U.S. PATENT DOCUMENTS

| | | | |
|---|---|---|---|
| 2011/0005580 A1* | 1/2011 | Vandermeulen | H02S 40/44 136/251 |
| 2012/0024283 A1 | 2/2012 | Skillman | |

(Continued)

FOREIGN PATENT DOCUMENTS

| | | |
|---|---|---|
| DE | 20010880 | 10/2001 |
| DE | 10102918 | 7/2002 |

(Continued)

OTHER PUBLICATIONS

Notification of Transmittal of Int'l Search Report and Written Opinion conducted in Int'l Appln. No. PCT/FR2016/050765, Forms PCT/ISA/220, PCT/ISA/210 and PCT/ISA/237.

*Primary Examiner* — Ryan S Cannon
(74) *Attorney, Agent, or Firm* — Greenblum & Bernstein, P.L.C.

(57) ABSTRACT

The invention relates to a hybrid solar panel comprising: a photovoltaic module; a heat exchanger arranged opposite in the rear surface of said photovoltaic module; a cooling fluid circulating in said exchanger; the heat exchanger including a heat exchange area; inner channels extending over the entire surface of the exchange area; the heat exchange area is made up of a double cellular plate with cells provided in the form of adjacent inner channels in fluid communication with the intake and discharge areas, characterised in that: the side ends are sealed; the plate comprises openings made in the lower wall in order to establish fluid communication between each channel and the intake and discharge areas, respectively; and the intake and discharge areas are provided in the form of collectors placed on the lower wall at the openings, so that said upper wall remains planar over the entire surface thereof.

21 Claims, 4 Drawing Sheets

(56) References Cited

U.S. PATENT DOCUMENTS

2015/0194557 A1\* 7/2015 Williams ................ H02S 30/10
136/248
2016/0007946 A1 3/2016 Brottier

FOREIGN PATENT DOCUMENTS

| | | | |
|---|---|---|---|
| DE | 102005024516 | 11/2006 | |
| EP | 0971419 A2 \* | 1/2000 | ......... F24D 17/0021 |
| EP | 2284910 | 2/2011 | |
| FR | 2070910 | 9/1971 | |
| FR | 2510733 | 2/1983 | |
| WO | 01/099203 | 12/2001 | |
| WO | 2005/028967 | 3/2005 | |
| WO | 2008/003109 | 1/2008 | |
| WO | 2012/069750 | 5/2012 | |
| WO | 2012/110758 | 8/2012 | |

\* cited by examiner

PHOTOVOLTAIC AND THERMAL SOLAR PANEL

TECHNICAL FIELD OF THE INVENTION

The aim of the invention is a thermal and photovoltaic solar (hybrid) panel as well as the method of manufacturing thereof.

It relates to the technical field of heat exchangers for the thermal control of hybrid solar panels.

PRIOR ART

Photovoltaic solar panels enable electrical energy to be generated from solar radiation. They comprise a plurality of photovoltaic elements (cells or thin layers), which operate according to the principle of the photoelectric effect. Generally, a plurality of photovoltaic elements are connected to one another on a photovoltaic solar panel, and a plurality of panels are connected to create a solar installation. Said installation generates electricity that can be consumed on site or to supply a distribution network.

Photovoltaic solar panels only convert a small part of the solar radiation into electricity, the remainder being unused heat. Said heat is detrimental to the electrical performance of solar panels as a reduction in the efficiency of photovoltaic elements with the temperature of approximately −0.45%/° C. can be observed. This is why it is doubly advantageous to cool photovoltaic solar panels. Indeed, not only does the efficiency of photovoltaic elements increase, but the heat from the cooling can be used in more or less complex heating systems. This is then referred to as hybrid solar panels capable of generating simultaneously electrical energy and thermal energy.

Generally, a heat exchanger is arranged opposite the rear face of the photovoltaic module so as to cool said latter. Patent document DE 101 02 918 (SCHULTZE-KRAFT ANDREAS) discloses such an exchanger for a conventional solar panel that is not hybrid.

Patent document WO 2012/069750 (SOLAIRE 2G) proposes a hybrid solar panel consisting of a heat exchanger comprising a heat exchange region in contact with the photovoltaic elements. Said exchange region has elements that enable the flow of a cooling fluid to be disrupted. Therefore, said configuration requires a fairly complex manufacture of the exchanger, consequently increasing the cost of the solar panel. In addition, the exchanger is preferentially manufactured from metal (stainless steel) again increasing the cost as well as the weight of the panel.

Patent document EP 2.284.910 (ROTH WERKE GMBH) partially addresses the aforementioned drawbacks. Indeed, the solar panel proposed consists of a photovoltaic module and a heat exchanger placed opposite the rear face of said module. At least one upper face of the exchanger is manufactured from plastic thus reducing the costs as well as the weight of the panel. The exchanger proposed comprises a heat exchange region beneath the photovoltaic module and wherein a cooling fluid flows. Said fluid moves in inner channels extending from a fluid inlet zone to a discharge zone.

The solar panel described in patent document EP 2.284.910 (ROTH WERKE GMBH) proposes an exchanger consisting of a lower face and an upper face separate from one another. In such a configuration, it is necessary to have at least one of the faces that is shaped in such a way as to be able to form the inner channels during the manufacture of the exchanger. Such a design requires having relatively thick (generally greater than 1.5 mm) walls. Such thicknesses reduce the heat exchange between the exchanger and the cooling fluid, making the efficiency of the solar panel mediocre. Furthermore, the design of such a panel is complex and requires considerable time and cost of manufacture.

In addition, in some installations, a thermosiphon effect is desired. Same corresponds to the natural circulation phenomenon of a liquid due to the change in mass thereof according to the temperature gradient. The configuration of the exchanger disclosed in patent EP 2.284.910 is likely to disrupt said thermosiphon effect, consequently, making the energy efficiency of the panel mediocre.

In addition, with the type of solar panel described in patent document EP 2.284.910, a deformation of the channels can be observed under pressure. Said deformation will lead to a deformation of the exchanger, and consequently, same is not correctly pressed against the rear face of the photovoltaic module, which contributes to limiting the heat exchanges and therefore reduces the energy efficiency of the solar panel.

Patent document WO 2008/003109 (BIERBAUMER HANS-PETER) discloses a solar panel wherein the heat exchange region is formed by a double-wall hollow sheet, said hollow sheet consists of an upper wall and a lower wall extending between two lateral ends of said plate and wherebetween cells are arranged, said cells are in the form of adjacent inner channels. Although the inlet and discharge zones for the fluid are not described, it appears in practice that the pressure drops in the channels are significant and that the circulation of the fluid in said channels is not homogeneous. Furthermore, the design of said type of channels is relatively complex.

The invention aims to remedy said situation. In particular, one objective of the invention is to simplify the design of exchangers for hybrid solar panels so as to reduce the costs.

Another objective of the invention is to reduce the pressure drops in the channels and improve the homogeneity of the circulation of the fluid.

A supplementary objective of the invention is to lighten the structure of the solar panel.

Another objective of the invention is to improve the heat exchanges between the photovoltaic module and the heat exchanger.

Again, another objective of the invention is to propose an exchanger the configuration of which makes it possible to obtain an optimized energy efficiency.

Another objective of the invention is to propose an exchanger that enables the thermosiphon effect to be maintained and/or promoted.

DISCLOSURE OF THE INVENTION

The solution proposed by the invention is a hybrid solar panel comprising:

a photovoltaic module comprising a front face and a rear face, a heat exchanger arranged opposite the rear face of said photovoltaic module, a cooling fluid circulating in said heat exchanger in such a way as to recuperate the heat of said photovoltaic module, said heat exchanger comprising a heat exchange region arranged beneath said photovoltaic module and wherein the cooling fluid flows, which fluid flows between an inlet zone and a discharge zone, inner channels extending over the entire surface of the exchange region, the heat exchange region is formed by a double-walled hollow sheet, wherein the hollow sheet consists of an upper wall and a lower wall extending between two lateral ends of said plate and wherebetween are arranged cells, wherein the cells are in the form of adjacent inner channels, which are in fluidic communication with the inlet and outlet zones.

This invention is remarkable in that:

the lateral ends are blocked, the hollow sheet comprises openings arranged in the lower wall to place in fluidic communication each channel respectively with the inlet zone and the discharge zone, the inlet and discharge zones are in the form of collectors placed along the lower wall of said hollow sheet at the openings, such that the upper wall of said latter lies flat over the entire surface thereof.

The use of such a hollow sheet makes it possible to obtain a very light and therefore easily handled exchanger. Inter alia, said hollow sheet, in addition to reducing the cost price of the hybrid solar panel, enables the energy efficiency to be improved. Indeed, said type of hollow sheet generally has very thin walls that promote heat exchanges with the photovoltaic module to which it is combined. In addition, the presence of adjacent inner channels enables a fluid to be circulated under a pressure that can reach up to 7 bar (0.7 MPa), the deformations of the exchanger being non-existent or at the very least negligible (less than 0.25 mm below 3 bar (0.3 MPa)), thus improving the performances of the hybrid solar panel. The arrangement of the openings makes it possible to simplify the design of the exchanger. The installation of collectors at said openings makes it possible to reduce the pressure drops in the channels and to have a homogeneous circulation of the fluid in each of said channels.

Other advantageous features of the invention are listed below. Each of said features can be considered alone or in combination with the remarkable features defined above, and be the subject matter, if applicable, of one or more divisional patent applications:

the hollow sheet is preferentially delimited by the two blocked lateral ends and two longitudinal edges; each of the openings having a rectangular shape that extends in the width of the hollow sheet parallel to the blocked lateral ends and perpendicularly to the longitudinal edges of said plate, the entire upper wall of the hollow sheet may be flat, the heat exchanger may be made of polypropylene, the collectors may be welded to the hollow sheet at one of the openings, each collector may be in the form of a watertight parallelepiped box which extends in the width of the hollow sheet, each collector may be equipped with a connector, which is not angled, oriented toward the outside of the panel, said connectors being offset from one another, the inner channels may have a width between 4 mm and 6 mm and a height between 4 mm and 6 mm, the depth of the collectors may be greater than the height of the inner channels, the hybrid solar panel may be formed by successive stacking of the following elements, arranged from the front face of the photovoltaic module toward the lower wall of the exchanger:

a layer or plate of a transparent material defining the front face of the photovoltaic module, a first layer of an encapsulating material in intimate contact with the layer or plate of transparent material, at least one photovoltaic element in intimate contact with the first layer of encapsulating material, a second layer of an encapsulating material in intimate contact with at least one photovoltaic element, the hollow sheet in intimate contact with the second layer of encapsulating material, a layer or plate of an insulating material in intimate contact with said hollow sheet.

the upper wall of the hollow sheet may have a thickness less than 1 mm, a supplementary insulating plate may be placed against the lower wall of the hollow sheet, the supplementary insulating plate may be a hollow sheet, the heat exchanger and the photovoltaic module may be held in place by a frame, said frame comprising pressure means so that the supplementary insulating plate is held against the lower wall of the hollow sheet such that the entire surface of the upper wall of said latter is pressed against the rear face of the photovoltaic module, a layer of gel may be placed between the heat exchange region and the photovoltaic module.

The invention also relates to a method of manufacturing a hybrid solar panel according to the invention comprising the steps consisting of:

using a hollow sheet the channels of which laterally lead into the ends of said plate, blocking the lateral ends of the hollow sheet in such a way as to seal the inner channels, arranging an opening at each lateral end of the lower wall of the plate such that each said opening leads into each of the channels, pressing the upper wall of the hollow sheet against the rear face of the photovoltaic module, holding the hollow sheet in position against the photovoltaic module, installing a collector at each of the openings, wherein the collectors form respectively an inlet zone and a discharge zone, connecting the collectors to a cooling fluid supply circuit such that the fluid flows from the inlet zone to the discharge zone.

The method may also contain a step consisting of holding the hollow sheet in position against the photovoltaic module by means of a frame, said frame comprising pressure means so that the supplementary insulating plate is held against the lower wall of the hollow sheet such that the entire surface of the upper wall of said latter is pressed against the rear face of the photovoltaic module.

DESCRIPTION OF FIGURES

Other advantages and features of the invention will become better apparent upon reading the description of a preferred embodiment that will follow, with reference to the appended drawings, given by way of indicative and non-limiting examples and in which:

FIGS. 9b and 9c are schematic bottom perspective views of variants of the panel of FIG. 9a.

PREFERRED EMBODIMENTS OF THE INVENTION

The solar panel P subject matter of the invention is a hybrid panel, that is to say that it is able to generate simultaneously electrical energy and thermal energy. It is intended to be used alone or in combination with other similar panels, so that the electrical and thermal energy that it generates can be used by a home or an installation.

Figure 1:
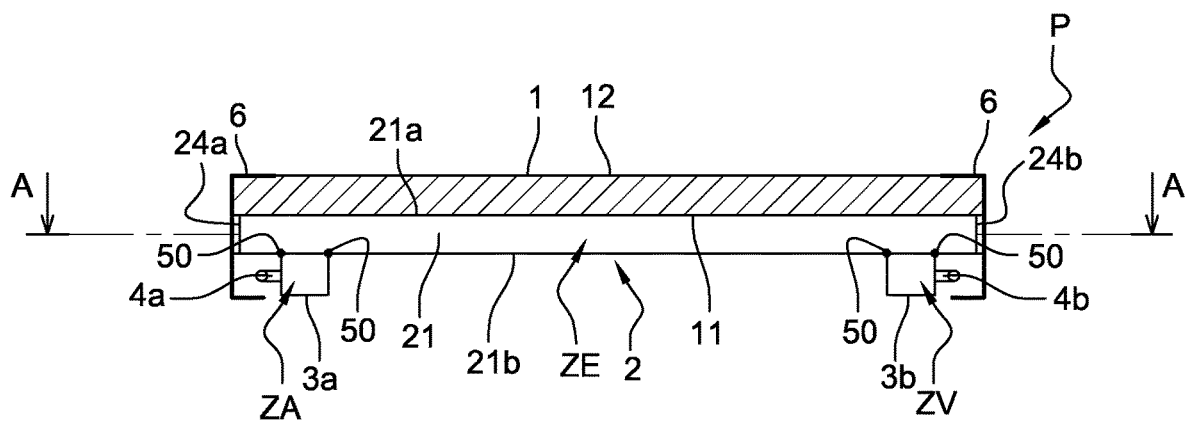
FIG. 1 is a schematic sectional representation of a hybrid solar panel in accordance with the invention.
Figure 2:
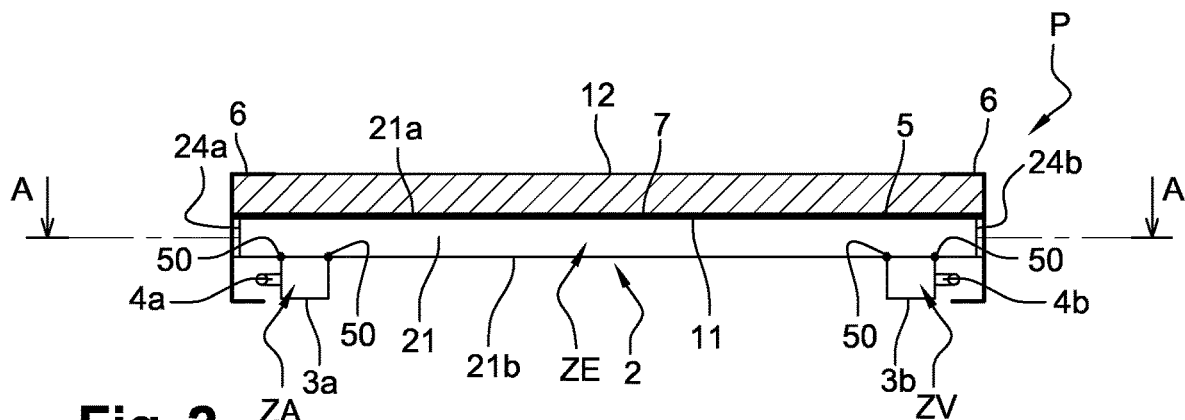
FIG. 2 is a schematic sectional representation of a hybrid solar panel in accordance with the invention, in an embodiment comprising a layer of gel between the photovoltaic module and the heat exchanger.

Referring to FIGS. 1 and 2, the solar panel P comprises a photovoltaic module 1 having a front face 12 and a rear face 11. The front face 12 is left free so that it can receive solar radiation. Approximately 80% of the solar energy received is dissipated in the panel P. The presence of a heat exchanger 2 placed opposite the rear face 11 of the photovoltaic module 1 makes it possible to recuperate the heat accumulated or dissipated in the photovoltaic module 1.

Figure 7:
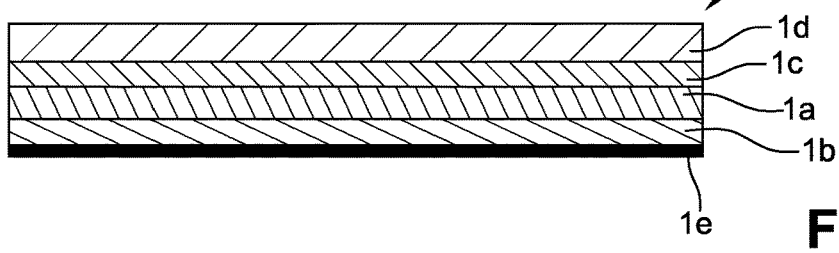
FIG. 7 is a schematic sectional representation of the various layers forming the photovoltaic module.

In FIG. 7, the photovoltaic module 1 comprises at least one, and advantageously a plurality of photovoltaic elements 1a placed in the same plane. Said latter are electrically connected to one another, in series or in parallel, and are encapsulated, for example, in a thermoplastic polymer 1b, 1c such as ethylene vinyl acetate (EVA) or even silicone for forming the photovoltaic module 1. The front face 12 of the photovoltaic module 1 exposed to the radiation is covered with a transparent plate 1d, such as, for example, a glass plate.

A layer 1e of electrically insulating material known as a "back sheet" is added to the rear face 11 of the photovoltaic module 1. Said layer 1e provides, in addition to the electrical insulation, a watertightness function between the photovoltaic module 1 and the heat exchanger 2. Said layer 1e may, for example, be a polyvinyl fluoride film, and makes it possible to prevent rain and/or the moisture of ambient air from coming into direct contact with the photovoltaic module 1, thus preventing any electrical problem, such as, for example, bad contacts or short circuits.

However, it is possible to eliminate the layer 1e of electrically insulating material. In said particular case, the rear face 11 is formed by the encapsulation layer 1b. The watertightness and electrically insulating function is therefore taken over by the heat exchanger 2, which therefore covers the entire surface of the photovoltaic module 1.

Said various elements 1a, 1b, 1c, 1d, 1e are stacked in the form of a sandwich and are held together by a hot rolling process.

The exchanger 2 is located beneath the photovoltaic module 1 in such a way as not to impede solar radiation. In the embodiment shown in FIG. 2, a layer 7 of pasty and/or malleable material is inserted between the rear face 11 of the photovoltaic module 1 and the upper face 21a of the heat exchanger 2. The use of a pasty and/or malleable material 7 enables the photovoltaic module 1 and the heat exchanger 2 to be maintained in contact despite the possible deformations of said latter, whilst preventing the presence of air between said two elements. The thickness of the layer 7 may vary by 0.1 mm to 1 cm, preferentially less than 1 mm, in a way such as to have a thin layer 7 enabling the heat to pass through despite the fact of using a thermally insulating material. The material used is preferentially a gel, but may also be in the form of a viscoelastic material, a glue, a polymer, or even any other form suitable to the person skilled in the art.

Figure 3:
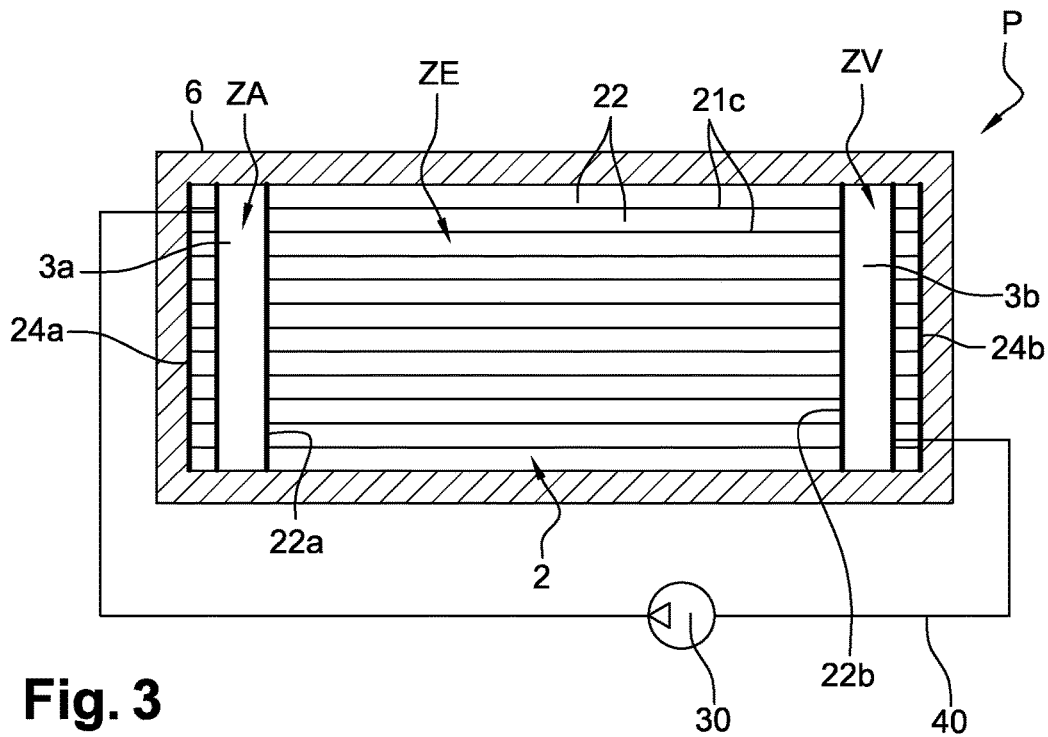
FIG. 3 is a sectional view along A-A of the panel according to one of FIG. 1 or 2.

Referring to FIG. 3, the exchanger 2 comprises three main zones: an inlet zone ZA for the cooling fluid, a heat exchange region ZE and a discharge zone ZV for said fluid. The photovoltaic module 1 is preferentially positioned opposite the exchange region ZE but may also be located at least partially above the inlet ZA and discharge ZV zones. The exchange region ZE may, for example, represent 10% to 100% of the surface of the photovoltaic module 1.

The heat exchanger 2 is made of plastic material, preferentially of polypropylene, but it may be made of polyethylene, poly(methyl methacrylate), poly(phenylene sulfide), poly(phenylene oxide), poly(phenylene ether), acrylonitrile-butadiene-styrene plastic, or even any other material suitable to the person skilled in the art. Said materials make it possible to be sustainably resistant to the corrosion generated by the cooling fluid, as well as to temperatures that can reach up to 90° C. The exchanger 2 may also consist of a polymer filled, such as, for example, with glass fibers, thus making it possible to improve the rigidity thereof.

The cooling fluid, which is typically glycol water, circulates in the heat exchanger 2 in order to recuperate the heat from the photovoltaic module 1. It is transported by means of a supply circuit 40 and always circulates in the same direction in the exchanger 2, from the inlet zone ZA to the discharge zone ZV passing through the heat exchange region ZE.

Figure 4:
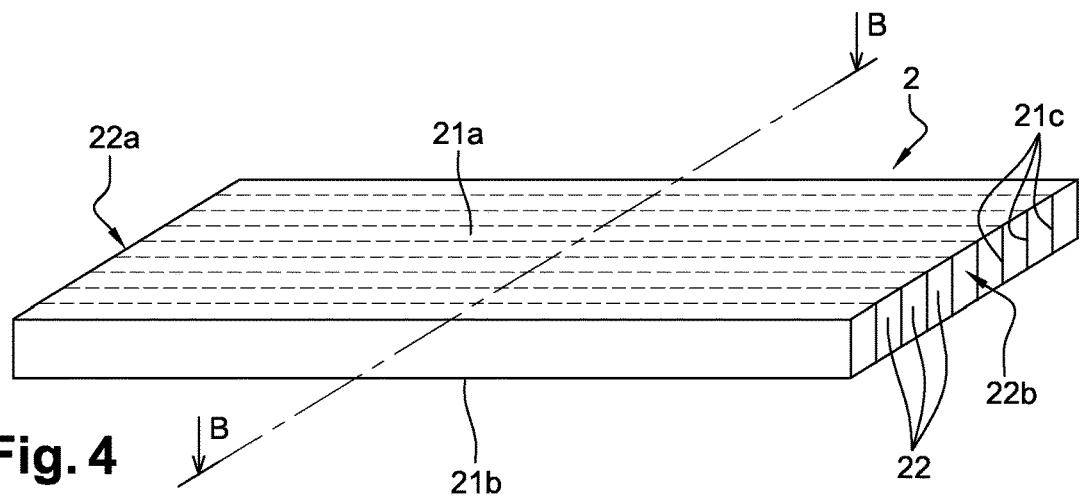
FIG. 4 is a schematic perspective view of a hollow sheet used in the invention.
Figure 5A:
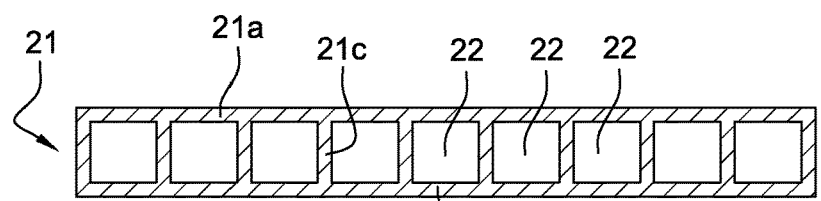
FIG. 5a is a sectional view along B-B of the hollow sheet of FIG. 4.

The exchanger 2 consists of a hollow sheet 21 and collectors 3a, 3b. The collectors 3a, 3b respectively form the inlet ZA and discharge ZV zones, whereas the exchange region ZE is formed by the hollow sheet 21. In FIGS. 4 and 5a, same consists of a flat upper wall 21a intended to be in contact with the rear face 11 of the photovoltaic module 1 and a lower wall 21b. The upper 21a and lower 21b walls are preferentially flat and parallel with one another. The surface of the plate 21 represents, for example, between 10% and 100% of the total surface of the photovoltaic module 1. Preferentially, it has dimensions (length and width) corresponding to same of the photovoltaic module 1, both being of general rectangular shape. It has a length that may be between 150 cm and 400 cm, a width varying between 50 cm and 300 cm, and a thickness varying between 1 mm and 2 cm. It may, for example, be manufactured by the company, DS Smith, under the brands Akysun®, Akylux®, Akyplac® or even Correx®, and obtained by an extrusion process or by molding.

In FIGS. 4 and 5a, cells in the form of channels 22 are arranged between the upper wall 21a and the lower wall 21b.

The channels 22 have a square, rectangular, circular or oval, trapezoidal section. They are preferentially straight. The inner channels 22 are delimited by inner partition walls 21c which are perpendicular or substantially perpendicular to the upper 21a and lower 21b walls, such that said channels 22 are adjacent. Two side-by-side adjacent inner channels 22 have thus a partition wall 21c in common. They are preferentially parallel to one another but may also be non-parallel.

Said walls 21a and 21b have a thickness between 0.4 mm and 10 mm, advantageously between 0.4 mm and 1.2 mm, preferentially 0.8 mm. Said thinness enables good heat transfer to be obtained between the photovoltaic module 1 and the cooling fluid that circulates in the channels 22. The inner walls 21c have a height that may vary from 1 mm to 2 cm, and a thickness between 0.4 mm and 1.2 mm. The height of the inner channels 22 therefore depends on the thickness of the plate 21 as well as on the height of the inner partition walls 21c. It is between 1 mm and 2 cm, preferentially 5 mm.

The width of the inner channels 22 varies from 1 mm to 20 mm, advantageously between 1 mm and 10 mm, preferentially 5 mm. The height thereof varies between 1 mm and 20 mm, preferentially 5 mm. The width of the channels 22 is chosen in a way such as to obtain negligible pressure drops and promote the thermosiphon effect during the circulation of the cooling fluid between the inlet zone ZA and discharge zone ZV. The applicant noticed surprisingly that the inner channels 22 having a square section of approximately 5 mm in dimension, made it possible to maintain a good thermosiphon effect between the inlet zone ZA and the discharge zone ZV.

The use of a hollow sheet 21 having inner channels 22 of dimensions such as described in the preceding paragraph, makes it possible to reduce the volume, and therefore the weight of the fluid circulating in the hybrid solar panel P. In addition, the adjacent channels 22 present in the plate 21 make it possible to withstand pressures that can reach up to 7 bar (0.7 MPa). The effects of the pressure of the fluid in the channels 22 is canceled out. The upper wall 21a of the plate 21 may possibly deform, said deformations being, however, limited, or even absent, due to the reduced dimensions of the channels 22.

The plastic material wherein the hollow sheet 21 is formed not naturally being a good heat conductor, the wall 21a preferentially has a minimum thickness to avoid slowing down the passage of the heat between the photovoltaic module 1 and the cooling fluid circulating in the heat exchange region ZE. However, said thickness must be significant enough to withstand aging as well as the pressure constraints of the heat exchanger 2 and thus prevent any possible rupture. The wall 21a having a thickness of approximately 0.8 mm gives very good results. The lower wall 21b may have a thickness greater than same of the wall 21a, thus making it possible to improve the rigidity of the panel P.

The channels 22 enable the cooling fluid to flow from the inlet zone ZA to the discharge zone ZV. Referring to FIG. 3, they each have an inlet 22a leading into the inlet zone ZA and an outlet 22b leading into the discharge zone ZV. The inlets 22a and outlets 22b may be located at the lateral ends of the hollow sheet 21, but they may also be offset from said lateral ends toward the center of said plate.

The collectors 3a, 3b and the hollow sheet 21 are preferentially separate parts. In the appended figures, each collector 3a, 3b is presented in the form of a watertight parallelepiped box which extends in the width of the hollow sheet 21, preferentially at each of the lateral ends thereof 24a, 24b, and more generally at each of the openings 23a, 23b. The length of the collectors 3a, 3b is, preferentially, substantially similar to the width of the hollow sheet 21 and may therefore be between 50 cm and 300 cm. The width thereof may vary from 5 cm to 50 cm and the height thereof from 1 mm to 2 cm. Preferentially, the height of the collectors 3a, 3b is greater than same of the inner channels 22 such that the pressure drop thereof is less than same of the channels 22. Thus, when the cooling fluid arrives in the inlet zone ZA, it will first fill said latter before penetrating into the channels 22. Similarly, the fluid will be able to drain away unhindered into the discharge zone ZV. The fluid will thus circulate in the channels 22, homogeneously, without preferential circuit and in the entire heat exchange region ZE.

The collectors 3a, 3b are formed by thermoforming, injection, or even extrusion. They are then welded preferentially on to the lower wall 21b of the hollow sheet 21 (FIG. 4a) in a way such as to facilitate the installation as well as the transportation of the solar panel P. Said position enables optimum stacking of the panels P and therefore a considerable space saving during the transport thereof. However, they may be installed at each of the ends of the plate 21, on the front face of the plate 21, or even any position suitable to the person skilled in the art.

As shown in FIG. 4, the channels 22 initially lead into the lateral ends 24a, 24b of the hollow sheet 21. In order to form the heat exchanger 2, said ends 24a, 24b are blocked in advance by a melting-pressing process toward the interior of the plate 21, or by adding material and gluing and/or welding, or by laser, or by ultrasounds, or by vibration, or even by compression heat-sealing (mirror, hot plate, infrared).

Figure 5B:
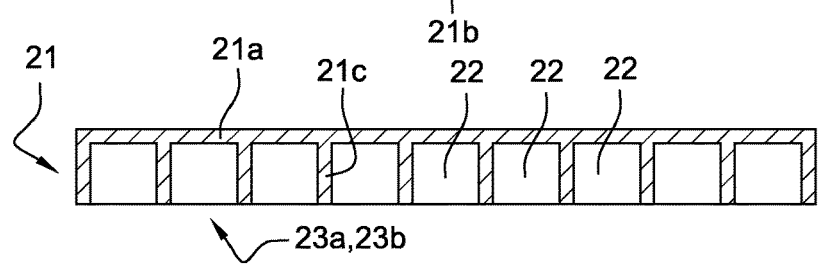
FIG. 5b shows the plate of FIG. 5a, whereon the lower wall has been removed.
Figure 8:
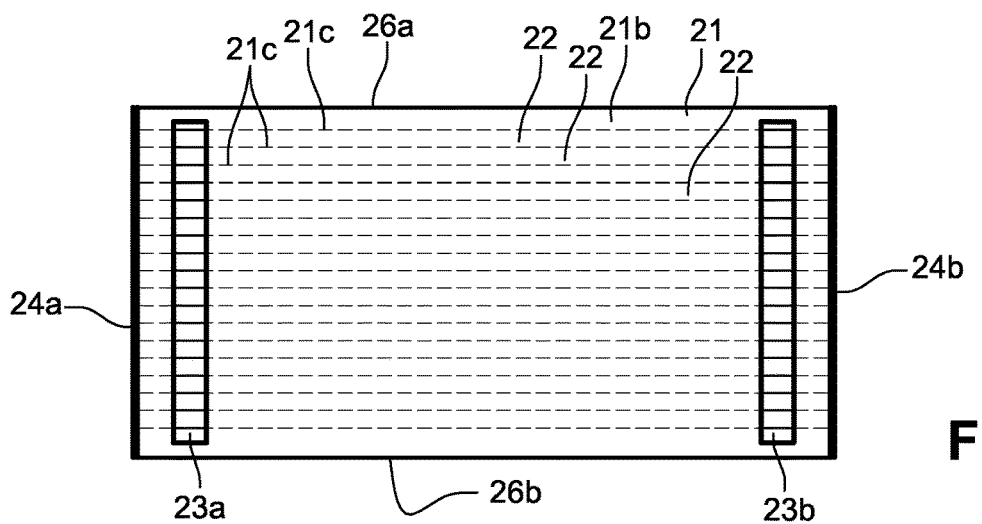
FIG. 8 is a schematic bottom view of a hollow sheet in accordance with the invention, the channels being blocked and the openings cut out.

FIGS. 5a to 5d illustrate the steps for achieving the installation of the collectors 3a, 3b against the hollow sheet 21. As shown in FIGS. 8 and 5b, openings 23a, 23b are produced in advance in the lower wall 21b of the hollow sheet 21. They are created by removing by cutting, parts of the lower wall 21b. Said openings 23a, 23b are located at the blocked ends 24a, 24b, and may be slightly offset from said latter by a few millimeters. Each of the openings 23a, 23b has a rectangular shape which extends in the width of the hollow sheet 21, parallel to the blocked lateral ends 24a, 24b and perpendicularly to the longitudinal edges 26a, 26b of said plate. They are preferentially performed over the entire width of the plate 21, but may be positioned in any other position so long as they lead into each of the inner channels 22. They have a length between 30 cm and 300 cm, and a width varying from 1 cm to 10 cm.

Figure 5C:
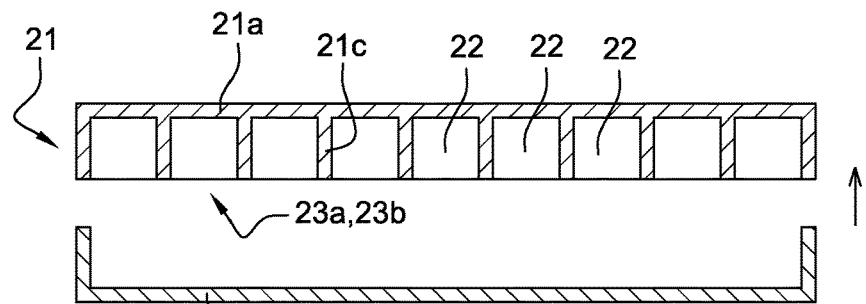
FIG. 5c shows the plate of FIG. 5b, combined with a collector.
Figure 5D:
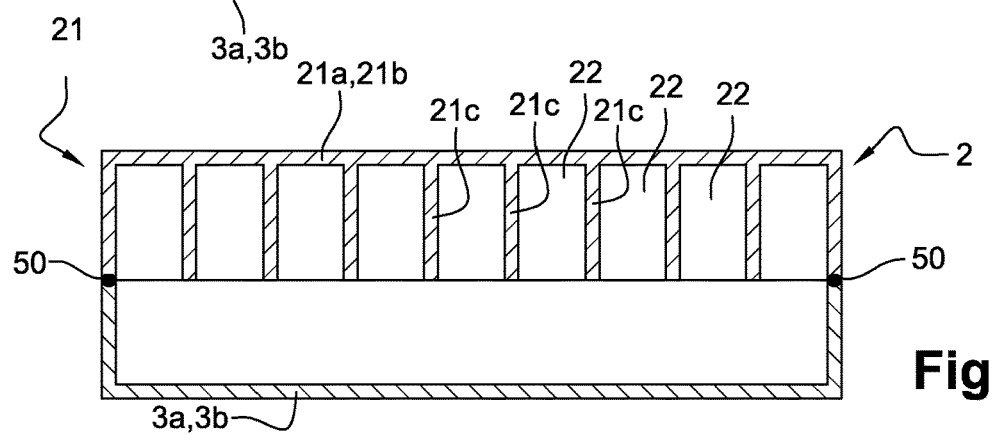
FIG. 5d shows the assembly of FIG. 5c, the collector being installed against the hollow sheet, FIG. 6a schematically shows a photovoltaic module combined with an exchanger in accordance with the invention.

Once said openings 23a, 23b have been produced, the collectors 3a, 3b can be attached (FIG. 5c). They are placed against the lower wall 21b of the hollow sheet 21, opposite the openings 23a, 23b, in a way such as to be in fluidic communication with each of the channels 22. Thus positioned against the lower wall 21b, the collectors 3a, 3b leave the upper wall 21a of the plate 21, totally flat. In fact, the entire surface of the upper wall 21a is likely to be in contact with the rear face 11 of the photovoltaic module 1, which makes it possible to maximize the heat exchange surface. The collectors 3a, 3b are then welded against the lower wall 21b of the hollow sheet 21. As shown, the collectors 3a, 3b extend downwardly in relation to the lower wall of the hollow sheet. More specifically, in the illustrated embodiment, as shown, the lower wall of the hollow sheet extends along a lower wall plane and the collectors extend downwardly from the lower wall plane. The weld 50 (FIG. 5d) may be performed in various ways, such as, for example, by adding material, by laser welding, ultrasonic welding, infrared or hot plate welding, or even vibration welding. The welding is preferentially performed by adding material for reinforcing the welding zones that are the mechanical stress zones when the solar panel P is used pressurized. Welding is the preferential choice, but depending on the polymer used, the collectors 3a, 3b, may also be glued or screwed against the hollow sheet 21.

In FIGS. 1, 2 and 3, the collectors 3a, 3b are provided with connection means 4a, 4b enabling the heat exchanger 2 to be connected to a cooling fluid supply circuit 40. Said connection means 4a, 4b may be connectors but may also be in any other form suitable to the person skilled in the art. Depending on the dimensions of the collectors 3a, 3b used, they may have an inside diameter of 8 mm to 30 mm. In said circuit 40, the fluid circulates naturally from the discharge zone ZV toward the inlet zone ZA by means of the thermosiphon effect. However, said circuit 40 may comprise a pump 30 providing the start of circulation of the cooling fluid. The supply pump 30 may be, for example, a piston pump or even a diaphragm pump.

Each connection means 4a, 4b may be produced in the same part as the collector 3a, 3b, and thus form a monobloc part which enables possible leaks of cooling fluid to be reduced. However, they may be separate parts that are installed subsequently on the collectors 3a, 3b by means of attachment means such as a weld, or by gluing, or even by screwing.

Figure 9A:
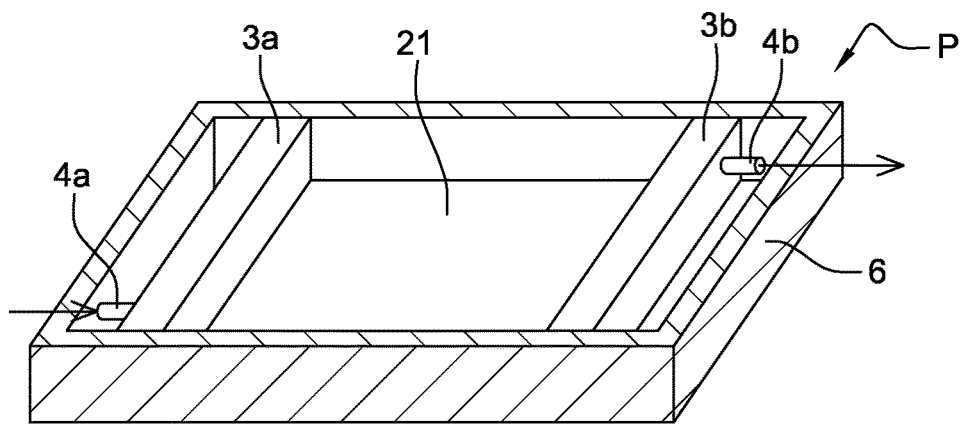
FIG. 9a is a schematic bottom perspective view of a hybrid solar panel in accordance with the invention.
Figure 9B:
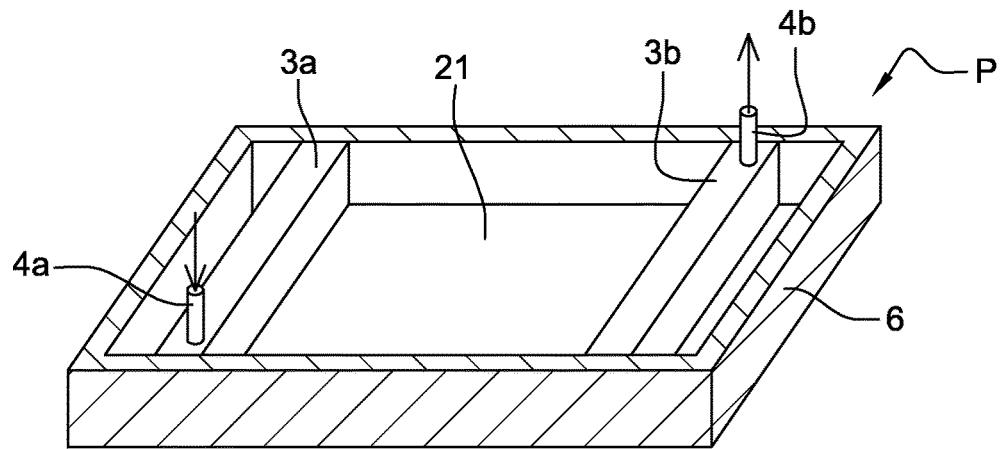
Figure 9C:
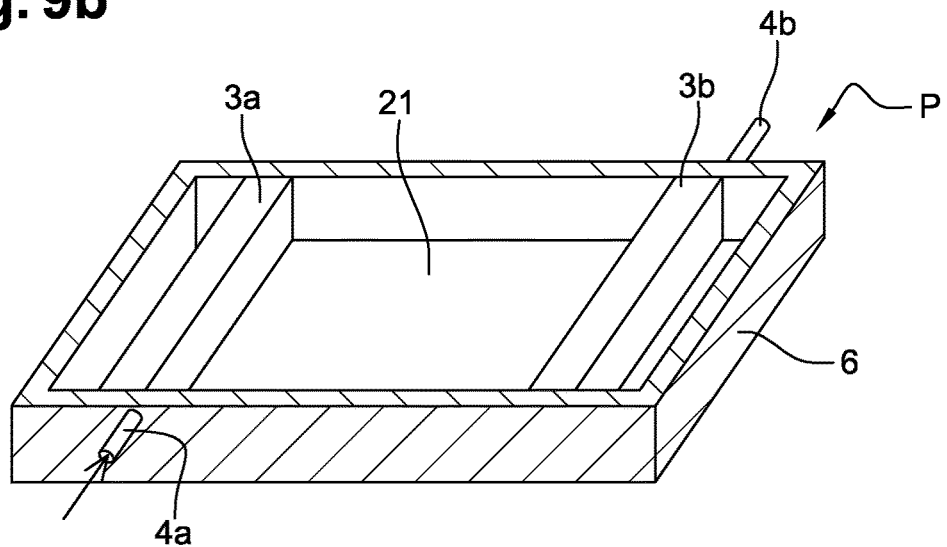

The connection means 4a, 4b are installed in advance to avoid generating a reverse slope likely to disrupt the thermosiphon effect previously described. Thus, they are preferentially position in a way such that the direction of flow of the cooling fluid goes from the bottom of the heat exchanger 2 toward the top. The connection means 4a, 4b are advantageously arranged in the plane of the hollow sheet 21 (FIG. 9a, FIG. 9c). However, they may also be arranged perpendicularly to the plate 21 (FIG. 9b). In the same way, said connection means 4a, 4b are preferentially installed in a way such as not to protrude from the frame 6 (FIG. 9a), however, they can go over the edges of the frame 6 (FIG. 9c).

The connection means 4a, 4b are preferentially arranged diagonally in relation to one another in a way such as to make uniform the path of the fluid from the inlet zone ZA to the discharge zone ZV. However, they may be placed in any position suitable to the person skilled in the art.

Figure 6A:
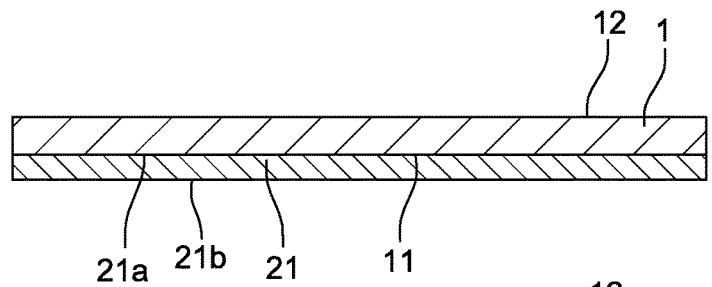
FIG. 6b shows the photovoltaic module and the exchanger of FIG. 6a combined with an insulating plate.
FIG. 6c shows the assembly of FIG. 6b held in position by a frame, in such a way as to form a hybrid solar panel in accordance with the invention.
Figure 6B:
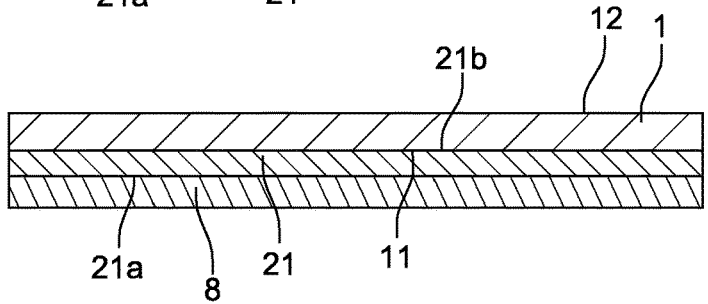

FIGS. 6a to 6d show various steps of a method of manufacturing a solar panel P. FIG. 6a shows the installation of the heat exchanger 2 against the rear face 11 of the photovoltaic module 1. In FIG. 6b, a supplementary plate 8 is installed against the lower wall 21b of the hollow sheet 21.

The plate 8 may be a layer of plastic such as polypropylene, polystyrene, polyurethane, or even polyethylene. It may also be in the form of a rigid honeycomb panel. The plate 8 is present over the entire surface corresponding to the exchange region (ZE) of the heat exchanger 2 with a length between 150 cm and 400 cm, a width varying from 50 cm to 300 cm. The thickness thereof is between 2 mm and 5 cm depending on the type of material used.

Figure 6C:
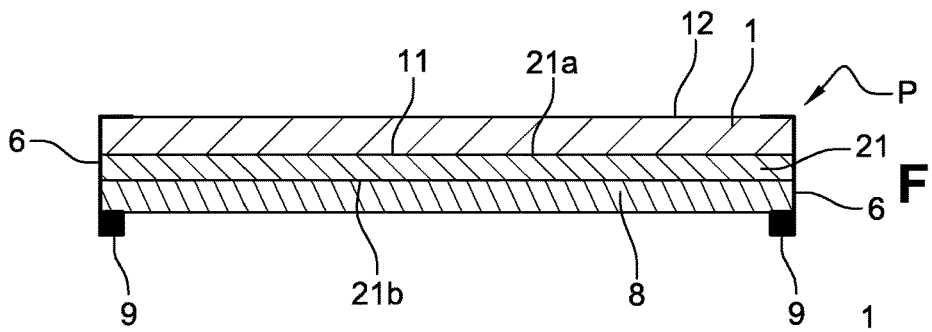

In addition to the insulating function thereof, the supplementary plate 8, when it is rigid, enables the heat exchanger 2 to be held in place in the case where the panel P comprises a frame 6. Said frame 6 is preferentially made of aluminum or polymer, and is formed of U-shaped sections assembled with one another by welding or by screwing. As illustrated in FIG. 6c, the frame 6 advantageously includes pressure means 9, or pressurer, for holding the plate 8 against the lower wall 21b of the hollow sheet 21. Said pressurer 9 may be in various forms, such as, for example, wedges added to the frame 6, wedges integrated into the frame 6, or even brackets.

By means of the plate 8 and the pressure means 9, the upper wall 21a of the hollow sheet 21 is pressed in the most uniform way possible against the rear face 11 of the photovoltaic module 1, which provides an optimum heat exchange. Preferentially, the assembly formed of the heat exchanger 2 and the plate 8, does not protrude from the frame 6 in such a way as to facilitate the transportation and installation of the photovoltaic panel.

The arrangement of the various elements and/or means and/or steps of the invention, in the above-described embodiments, must not be understood as requiring such an arrangement in all implementations. In any case, it will be understood that various modifications can be made to said elements and/or means and/or steps, without deviating from the spirit and scope of the invention. In particular:

There may or may not be a layer 7 between the photovoltaic module 1 and the heat exchanger 2, the lower wall 21b is not necessarily identical to the upper wall 21a, the lower wall 21b may have a thickness greater than 1 mm, the hybrid solar panel P may or may not comprise a supplementary plate 8, in this case the pressure means 9 are directly bearing against the hollow sheet 21, the collectors 3a, 3b may be slightly inserted into the openings 23a, 23b before performing the weld 50, the pressure means 9 may be different from same previously mentioned. They may, for example, be in the form of bars connecting the longitudinal edges 26a, 26b of the plate 21, in the photovoltaic module 1, the glass 1d can be replaced by a material known as a "front sheet", transparent, flexible, resistant to ultraviolet rays, for example, fluoropolymer-based such as tetrafluoroethylene or ETFE, the layers 1b, 1c of encapsulating material are not necessarily the same.

The invention claimed is:

1. A hybrid solar panel comprising:
a photovoltaic module comprising a front face and a rear face,
a heat exchanger arranged opposite the rear face of said photovoltaic module,
a cooling fluid circulating in said heat exchanger in such a way as to recuperate heat of said photovoltaic module,
the heat exchanger comprising a heat exchange region arranged beneath said photovoltaic module and wherein the cooling fluid flows, which fluid flows between an inlet zone and a discharge zone of the heat exchanger,
the heat exchanger comprising inner channels extending over an entire surface of the exchange region,
the heat exchange region being formed by a double-walled hollow sheet, the hollow sheet being a single piece structure, wherein the hollow sheet comprises an upper wall and a lower wall extending between two lateral ends of the hollow sheet, and wherein cells are arranged between the two lateral ends of the hollow sheet, and the cells are in the form of adjacent inner channels, the adjacent inner channels being in fluidic communication with the inlet and discharge zones,
wherein:

the lateral ends of the hollow sheet are blocked, the lateral ends and two longitudinal edges delimiting the hollow sheet, the hollow sheet comprises a first opening arranged in the lower wall thereof, the first opening leading into each of the inner channels to place in fluidic communication each channel with the inlet zone, and the hollow sheet comprises a second opening provided in the lower wall thereof, the second opening leading into each of the inner channels to place in fluidic communication each channel with the discharge zone, each of the first and second openings has a rectangular shape extending along a width of the hollow sheet parallel to the blocked lateral ends and perpendicularly to the longitudinal edges of the hollow sheet, the inlet and discharge zones are in the form of collectors placed along the lower wall of the hollow sheet at the first and second openings, such that the upper wall of the hollow sheet lies flat over the entire surface thereof.

2. The hybrid solar panel according to claim 1, wherein the entire upper wall of the hollow sheet is flat.

3. The hybrid solar panel according to claim 1, wherein the heat exchanger is made of polypropylene.

4. The hybrid solar panel according to claim 1, wherein each collector is welded to the hollow sheet at one of the openings.

5. The hybrid solar panel according to claim 1, wherein each collector is in the form of a watertight parallelepiped box which extends in the width of the hollow sheet.

6. The hybrid solar panel according to claim 1, wherein each collector is equipped with a connector, which is not angled, oriented toward the outside of the panel, the connectors being offset from one another.

7. The hybrid solar panel according to claim 1, wherein the depth of the collectors is greater than the height of the inner channels.

8. The hybrid solar panel according to claim 1, wherein the hybrid solar panel is formed by successive stacking of the following elements, arranged from the front face of the photovoltaic module toward the lower wall of the exchanger:
  a layer or plate of a transparent material defining the front face of the photovoltaic module,
  a first layer of an encapsulating material in intimate contact with the layer or plate of transparent material,
  at least one photovoltaic element in intimate contact with the first layer of encapsulating material,
  a second layer of an encapsulating material in intimate contact with the at least one photovoltaic element,
  the hollow sheet in intimate contact with the second layer of encapsulating material,
  a layer or plate of an insulating material in intimate contact with the hollow sheet.

9. The hybrid solar panel according to claim 1, wherein the inner channels have a width between 4 mm and 6 mm and a height between 4 mm and 6 mm.

10. The hybrid solar panel according to claim 1, wherein the upper wall of the hollow sheet, has a thickness less than 1 mm.

11. The hybrid solar panel according to claim 1, wherein a supplementary insulating plate is placed against the lower wall of the hollow sheet.

12. The hybrid solar panel according to claim 11, wherein the supplementary insulating plate is a hollow sheet.

13. The hybrid solar panel according to claim 11, wherein the heat exchanger and the photovoltaic module are held in place by a frame, said frame comprising a pressure device so that the supplementary insulating plate is held against the lower wall of the hollow sheet such that the entire surface of the upper wall of the hollow sheet is pressed against the rear face of the photovoltaic module.

14. The hybrid solar panel according to claim 13, wherein a layer of gel is placed between the heat exchange region and the photovoltaic module.

15. The hybrid solar panel according to claim 1, wherein the lower wall of the hollow sheet has a thickness greater than the thickness of the upper wall.

16. The hybrid solar panel according to claim 1, wherein the heat exchanger and the photovoltaic module are held in place in a frame, the frame comprising a pressurer against the hollow sheet so that an entire surface of the upper wall of the hollow sheet is pressed against the rear face of the photovoltaic module.

17. A hybrid solar panel comprising:
  a photovoltaic module comprising a front face and a rear face,
  a heat exchanger arranged opposite the rear face of said photovoltaic module,
  a cooling fluid circulating in said heat exchanger in such a way as to recuperate heat of said photovoltaic module,
  the heat exchanger comprising a heat exchange region arranged beneath said photovoltaic module and wherein the cooling fluid flows, which fluid flows between an inlet zone and a discharge zone of the heat exchanger,
  the heat exchanger comprising inner channels extending over an entire surface of the exchange region,
  the heat exchange region being formed by a double-walled hollow sheet, the hollow sheet being a single piece structure, wherein the hollow sheet comprises an upper wall and a lower wall extending between two lateral ends of the hollow sheet, and wherein cells are arranged between the two lateral ends of the hollow sheet, and the cells are in the form of adjacent inner channels, the adjacent inner channels being in fluidic communication with the inlet and discharge zones,
wherein:
  the lateral ends of the hollow sheet are blocked, the lateral ends and two longitudinal edges delimiting the hollow sheet,
  the hollow sheet comprises a first opening arranged in the lower wall thereof, the first opening leading into each of the inner channels to place in fluidic communication each channel with the inlet zone, and the hollow sheet comprises a second opening provided in the lower wall thereof, the second opening leading into each of the inner channels to place in fluidic communication each channel with the discharge zone,
  each of the first and second openings have a rectangular shape extending along a width of the hollow sheet parallel to the blocked lateral ends and perpendicularly to the longitudinal edges of the hollow sheet,
  the inlet and discharge zones are in the form of collectors placed along the lower wall of the hollow sheet at the first and second openings, such that the upper wall of the hollow sheet lies flat over the entire surface thereof; and
  the collectors extend downwardly from the lower wall of the hollow sheet.

18. The hybrid solar panel according to claim 17, wherein the lower wall of the hollow sheet extends along a lower wall plane and the collectors extend downwardly from the lower wall plane.

19. A method of manufacturing a hybrid solar panel according to claim 1, comprising:
- blocking the lateral ends of the hollow sheet so as to seal the inner channels,
- arranging an opening at each lateral end of the lower wall of the hollow sheet such that each said opening leads into each of the channels,
- pressing the upper wall of the hollow sheet against the rear face of the photovoltaic module,
- holding the hollow sheet in position against the photovoltaic module,
- installing a collector at each of the first and second openings, wherein the collectors form respectively an inlet zone and a discharge zone,
- connecting the collectors to a cooling fluid supply circuit such that the fluid flows from the inlet zone to the discharge zone.

20. The method of manufacturing according to claim 19, further comprising:
- holding the hollow sheet in position against the photovoltaic module by way of a frame, said frame comprising a pressurer so that the supplementary insulating plate is held against the lower wall of the hollow sheet such that the entire surface of the upper wall of the hollow sheet is pressed against the rear face of the photovoltaic module.

21. The method of manufacturing according to claim 19, further comprising:
- blocking the lateral ends of the hollow sheet by any one or more of the following processing methods: melting-pressing process toward an interior of the hollow sheet; adding material and gluing; welding; laser; vibration; or
- compressing heat-sealing.

* * * * *